(12) United States Patent
Shen et al.

(10) Patent No.: US 11,736,118 B2
(45) Date of Patent: Aug. 22, 2023

(54) METHOD FOR OUTPUTTING A CURRENT AND CURRENT OUTPUT CIRCUIT

(71) Applicant: REALTEK SEMICONDUCTOR CORPORATION, Hsinchu (TW)

(72) Inventors: Juei Chin Shen, Hsinchu (TW); Liang Huan Lei, Hsinchu (TW); Chien Wen Chen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 46 days.

(21) Appl. No.: 17/464,239

(22) Filed: Sep. 1, 2021

(65) Prior Publication Data
US 2022/0247424 A1    Aug. 4, 2022

(30) Foreign Application Priority Data

Feb. 3, 2021  (TW) .................................. 110104015

(51) Int. Cl.
  *H03M 1/74*    (2006.01)
  *H03M 1/10*    (2006.01)
  *H03M 1/06*    (2006.01)

(52) U.S. Cl.
  CPC ......... *H03M 1/742* (2013.01); *H03M 1/0636* (2013.01); *H03M 1/1033* (2013.01); *H03M 1/747* (2013.01)

(58) Field of Classification Search
  CPC .... H03M 1/742; H03M 1/0653; H03M 1/685; H03M 1/747

USPC .................................................. 341/120, 144
See application file for complete search history.

(56) References Cited

U.S. PATENT DOCUMENTS

| 6,118,398 | A  |   | 9/2000  | Fisher et al. |
| 6,317,066 | B1 | * | 11/2001 | Chiang ............... H03M 1/0651 341/144 |
| 7,541,953 | B2 |   | 6/2009  | Chen et al. |
| 8,471,739 | B2 | * | 6/2013  | Choi ................... H03M 1/0653 341/120 |

OTHER PUBLICATIONS

JT. Zeng and D. Chen, "An Order-Statistics Based Matching Strategy for Circuit Components in Data Converters," in IEEE Transactions on Circuits and System I: Regular Papers, vol. 60, No. 1, pp. 11-24, published by Jan. 2013.

(Continued)

*Primary Examiner* — Khai M Nguyen
(74) *Attorney, Agent, or Firm* — WPAT, P.C., Intellectual Property Attorneys; Anthony King

(57) ABSTRACT

A method for outputting a current includes performing a sorting operation on a plurality of current sources according to intensities of currents generated by the current sources, dividing the plurality of current sources into N current source sets according to a result of the sorting operation and a predetermined selection order, and enabling at least one current source set of the N current source sets to output the current according a target output value. The plurality of current sources have a same target current value. Each of the N current source sets includes at least one current source. In the N current source sets, a total quantity of current sources of the $n^{th}$ current source set is twice a total quantity of current sources of the $(n-1)^{th}$ current source set.

20 Claims, 5 Drawing Sheets

(56) References Cited

OTHER PUBLICATIONS

T. Chen and . . . , "A 14-bit200-MHz Current-Steering DAC With Switching-Sequence Post-Adjustment Calibration," in IEEE Journal of Solid-State Circuits, vol. 42, issue: 11, Nov. 2007.

* cited by examiner

METHOD FOR OUTPUTTING A CURRENT AND CURRENT OUTPUT CIRCUIT

CROSS-REFERENCE TO RELATED APPLICATIONS

This application claims priority of Taiwan application No. 110104015, filed on Feb. 3, 2021, which is incorporated by reference in its entirety.

TECHNICAL FIELD

The present application relates to a circuit; in particular, to a current output circuit and a related method.

BACKGROUND

A digital to analog converter (DAC) converts a digital input signal into an analog output signal. For example, a DAC can generate a current as an output signal with corresponding intensity according to the digital signal's value. Conventionally, DACs may contain multiple current sources and may enable a corresponding number of current sources depending on the desired output current value.

However, due to process variations, different current sources may, in fact, generate currents of different magnitudes even if they have the same target current value, resulting in poor linearity between the analog output current signal and the digital input numerical signal. For example, when it is desired to increase the output current of the DAC, if the current sources in the DAC are randomly selected to be enabled for increasing the current output, then the overall output current may decrease even though the number of selected current sources increases. For example, if three current sources that generate the greatest currents (for example, each generates a current of 1.2 mA) in the DAC are selected in a first stage, and four current sources that generate the smallest currents (for example, each generates a current of 0.8 mA) in the DAC are selected in a second stage, then the total current generated in the first stage may be smaller than the total current generated in the second stage. This non-monotonic and non-linear performance often leads to system errors. Therefore, how to properly control the current source to improve the current output's linearity is still an issue to be solved.

SUMMARY OF THE INVENTION

One embodiment of the present disclosure discloses a method for outputting current. The method includes performing a sorting operation on a plurality of current sources according to intensities of currents outputted by the plurality of current sources, dividing the plurality of current sources into N current source sets according to a result of the sorting operation and a predetermined selection order, and enabling at least one current source set of the N current source sets to output a current according to a target output value. The plurality of current sources have a same first target current value, and each current source set of the N current source sets comprises at least one current source. In the N current source sets, a total quantity of current sources of the $n^{th}$ current source set is twice a total quantity of current sources of the $(n-1)^{th}$ current source set, and N is an integer.

Another embodiment of the present disclosure discloses a current output circuit. The current output circuit includes a current source array, a current comparison circuit, and a current source control circuit. The current source array includes a plurality of current sources, wherein the plurality of current sources have a same first target current value. The current comparison circuit is coupled to the plurality of current sources, and configured to compare intensities of currents outputted by the plurality of current sources to perform a sorting operation on the plurality of current sources. The current source control circuit is coupled to the plurality of current sources and the current comparison circuit, and configured to divide the plurality of current sources into N current source sets for individual control according to the result of the sorting operation and a predetermined selection order, and to enable at least one current source set of the N current source sets to output a current according to a target output value. Each current source set of the N current source sets comprises at least one current source. In the N current source sets, a total quantity of current sources of the $n^{th}$ current source set is twice a total quantity of current sources of the $(n-1)^{th}$ current source set, and N is an integer greater than 1, and n is an integer greater than 1 and smaller than or equal to N.

The current output circuit and method for outputting current provided by embodiments of the present disclosure can perform the sorting operation on current sources and divide current sources according to the result of the sorting operation so that the error of the current sources may be offset by each other, thereby decreasing the integral nonlinearity (INL) error.

DETAILED DESCRIPTION

Figure 1:
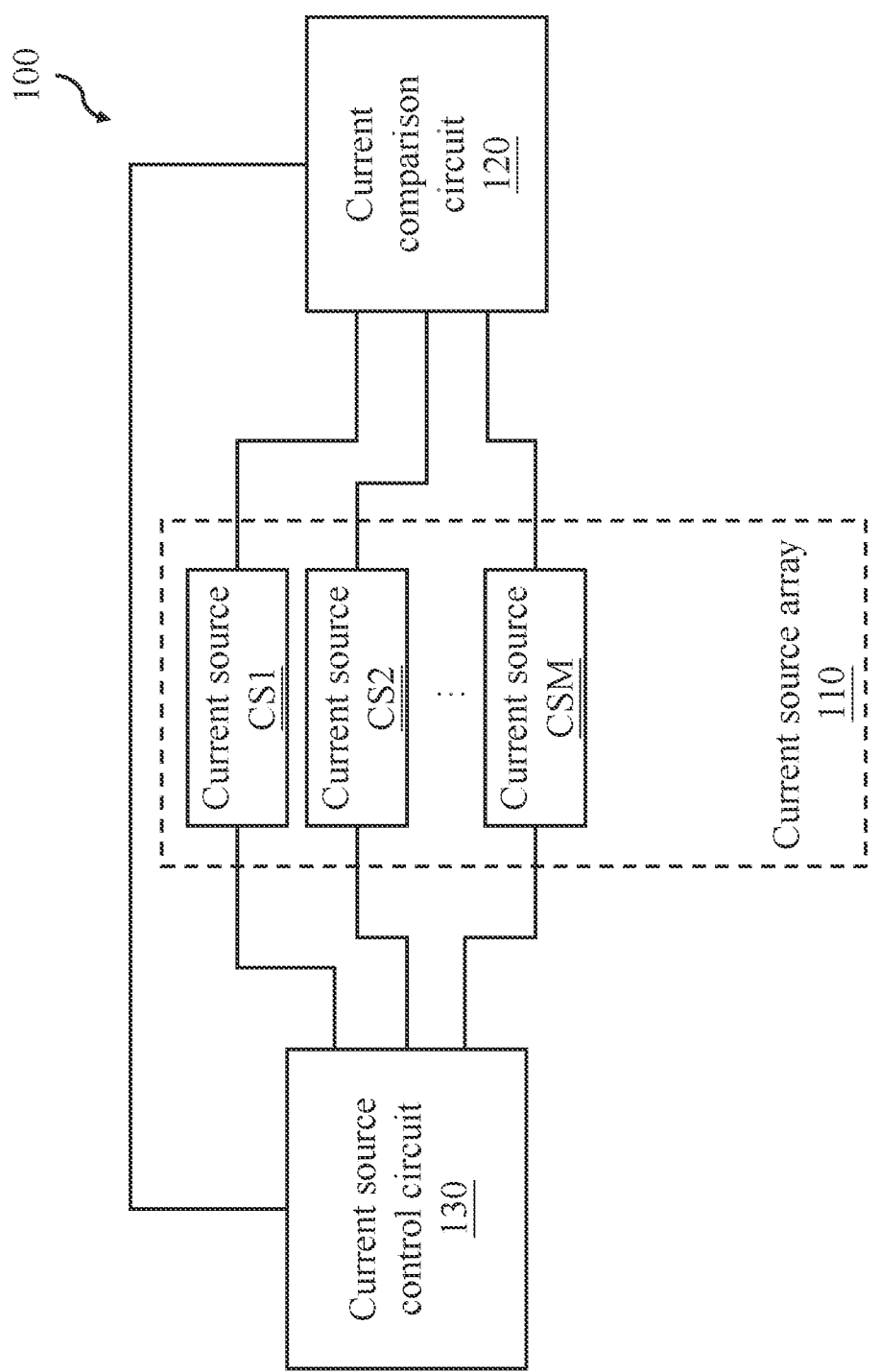
FIG. 1 is a schematic diagram illustrating a current output circuit according to one embodiment of the present disclosure.

FIG. 1 is a schematic diagram illustrating a current output circuit 100 according to one embodiment of the present disclosure. The current output circuit 100 may include a current source array 110, a current comparison circuit 120, and a current source control circuit 130. The current comparison circuit 120 may be coupled to the current sources CS1 to CSM, whereas the current source control circuit 130 may be coupled to the current sources CS1 to CSM and the current comparison circuit 120.

The current source array 110 may include M current sources CS1 to CSM, and the current sources CS1 to CSM may have the same target current value, wherein M is an integer greater than 1. Although the current sources CS1 to CSM have the same target current value, variations in the manufacturing process would result in deviations such that the actual currents generated by the current sources CS1 to CSM may deviate from the target current value to different extents. In some embodiments, the current source array 110 can be applied in a DAC circuit; in such examples, the deviations of current sources CS1 to CSM may result in a decrease in the linearity when the DAC circuit converts the input signal to an output current. To address this issue, the present current comparison circuit 120 first performs a sorting operation on the current sources CS1 to CSM according to intensities of currents outputted by the current sources CS1 to CSM, and the current source control circuit 130 can divide the current sources CS1 to CSM into N current source sets according to the result of the sorting operation and a predetermined selection order, so as to control the current sources separately.

In the present embodiment, each current source set may include at least one current source, and in N current source sets, a total quantity of current sources of the $n^{th}$ current source set is twice a total quantity of current sources of the $(n-1)^{th}$ current source set, wherein N is an integer greater than 1, and n is an integer greater than 1 and smaller than or equal to N. For example, the total quantity of current sources of the second current source set is twice the total quantity of current sources of the first current source set, and the total quantity of current sources of the third current source set is twice the total quantity of current sources of the second current source set. In other words, the current source control circuit 130 may divide the current sources CS1 to CSM into N current source sets for binary coding according to the result of the sorting operation and the predetermined selection order. In this case, the value of M can be $(2^N-1)$. Consequently, the current source control circuit 130 can enable the corresponding current source set(s) in the N current source sets to output current according to the target output value.

Figure 2:
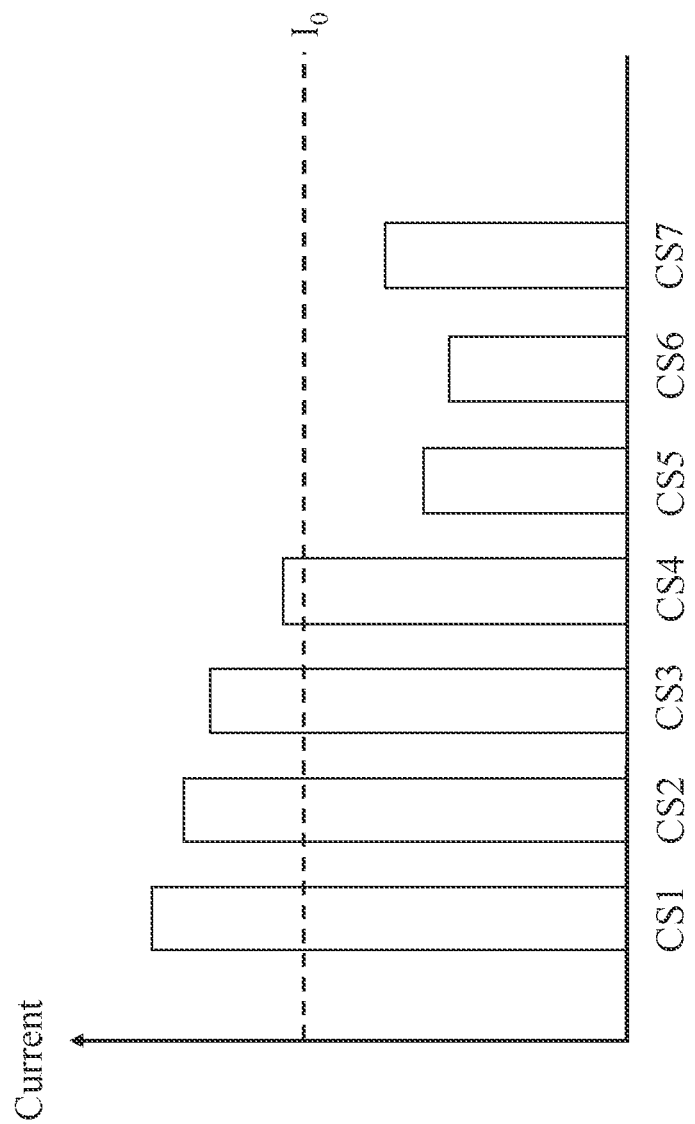
FIG. 2 is a schematic diagram showing intensities of currents outputted by current sources according to one embodiment of the present disclosure.

In the following embodiment, an M of 7 and an N of 3 are used for discussions to facilitate understanding the present disclosure. FIG. 2 is a schematic diagram showing intensities of currents outputted by current sources CS1 to CS7. In FIG. 2, since the currents outputted by the current sources CS1 to CS4 are greater than a standard target current $I_0$, if the current sources CS1 to CS7 are enabled in the order of CS1 to CS7 to increase the step of the output current, we will observe that the integral nonlinearity error of the step current will continue to rise until the current source CS5 is enabled, and then slowly decreases.

Figure 3:
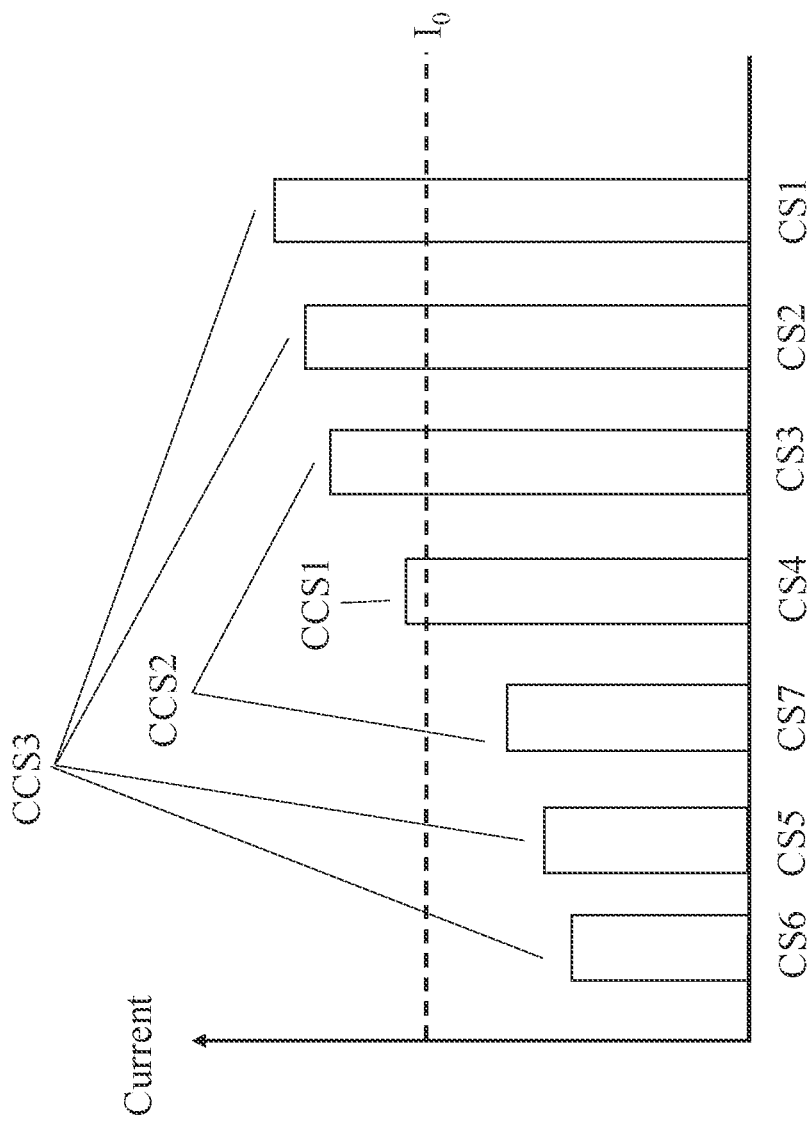
FIG. 3 is a schematic diagram showing that the current sources in FIG. 2 are sorted according to the output current intensities.

FIG. 3 is a schematic diagram showing that the current sources CS1 to CS7 are sorted according to the output current intensities. In FIG. 3, the median current source CS4 has the median current intensity among current sources CS1 to CS7. In the case that the overall distribution of the degree of the error of the current sources CS1 to CS7 is a normal distribution, the intensity of the current outputted by the median current source CS4 is usually the closest to the average value of the currents of current sources CS1 to CS7. Therefore, in the present embodiment, the current source control circuit 130 may use the median current source CS4 as a reference and select the median current source CS4 as a first current source set CSS1. Moreover, ideally, the current outputted by the second current source set CSS2 should be twice the current outputted by the first current source set CSS1; therefore, the current source control circuit 130 will select two current sources from the current sources CS1 to CS3 and the current sources CS5 to SC7 as the second current source set CSS2. In the case where the overall distribution of the degree of the error of the current sources CS1 to CS7 is a normal distribution, among current sources CS6, CS5, CS7, CS3, CS2, and CS1, the current difference between the current source CS7 (the current source preceding the median current source CS4 when sorted by the current intensity) and the median current source CS4, as well as the current difference between the current source CS3 (the current source succeeding the median current source CS4 when sorted by the current intensity), shall be the two smallest, and the signs of said two current differences are opposite; therefore, the errors of the current source CS7 and the current source CS3 can be compensated by each other and it has the highest probability that the sum of the currents outputted by the current source CS7 and the current source CS3 is closest to twice the current outputted by the median current source CS4. In this case, the current source control circuit 130 may preferentially select the current source CS7 and the current source CS3 as the second current source set CSS2.

Similarly, the current outputted by the third current source set CSS3 should be twice the current outputted by the second current source set CSS2; therefore, the current source control circuit 130 would select four current sources from the current sources CS1 to CS2 and CS5 to CS6 as a third current source set CSS3. That is, current sources CS1, CS2, CS5, and CS6 will all be selected into the third current source set CSS3. Since the current intensities of the current sources CS5 and CS6 are respectively ranked as the second place and the third place before the median current source CS4, and the current intensities of the current sources CS2 and CS1 are respectively ranked as the second place and third place after the median current source CS4, in the case where the overall distribution of the degree of the error of the current sources CS1 to CS7 is a normal distribution, the current error generated by the current sources CS5 and CS6 and the current error generated by the current sources CS1 and CS2 can be compensated by each other so that the sum of the current outputted by current sources CS1, CS2, CS5, and CS6 should be rather close to twice the current outputted by the second current source set CSS2 in terms of probability.

Since the current output circuit 100 may use the current comparison circuit 120 to perform the sorting operation on the current outputted by the current sources CS1 to CSM in the current source array 110 and then use the current source control circuit 130 to divide the current sources CS1 to CSM into N current source sets for binary coding according to a predetermined selection order, it is feasible to divide the current sources CS1 to CS7 into corresponding current source sets speedily without having to perform multiple times of comparisons or other complex operations repeatedly.

The embodiment mentioned above uses an example where M is 7; however, when M is any other value, the current source control circuit 130 can still divide the current sources CS1 to CSM into N current source sets according to the same selection order. For example, the current source control circuit 130 may first select the median current source having a current intensity that is ranked as the median among the current sources CS1 to CSM as a first current source set among the N current source sets; then, it may select $2^{(n-2)}$ current sources starting from the $[2^{(n-1)}-1]^{th}$ place before the median current source in the current intensity ranking, as well as $2^{(n-2)}$ current sources starting from the $[2^{(n-1)}-1]^{th}$ place after the median current source in the current intensity ranking as the $n^{th}$ current source set of the N current source sets. For example, when n is 4, the current source control circuit 130 can include the four current sources starting from the $7^{th}$ current source (including the $7^{th}$ current source) before the median current source in the fourth current source set. That is, the $4^{th}$, $5^{th}$, $6^{th}$, and $7^{th}$ current source before the median current source will be selected as the fourth current source set. Also, the current source control circuit 130 can include the four current sources starting from the $7^{th}$ current source (including the $7^{th}$ current source) after the median current source in the fourth current source set. That is, the $4^{th}$, $5^{th}$, $6^{th}$, and $7^{th}$ current source after the median current source will also be selected as the fourth current source set.

That is, the current source control circuit 130 can still use the median current source as a reference according to the result of the sorting operation, and gradually select each current source into the corresponding current source set in a symmetrical manner. In the case where the overall distribution of the degree of the error of the current sources CS1 to CSM is a normal distribution, the current outputted by the median current source among the current sources CS1 to CSM is closest to the target current $I_0$, and the differences between the currents outputted by other current sources and the target current $I_0$ will also show a symmetrical distribution. For example, 50% of the current sources from the current sources CS1 to CSM may generate currents greater than the target current $I_0$, and about 34.1% of the current sources may generate currents greater than the target current $I_0$ within one standard difference. Also, another 50% of the current sources from the current sources CS1 to CSM may generate currents less than the target current $I_0$, and about 34.1% of the current sources may generate currents less than the target current $I_0$ within one standard difference. In such cases, grouping the current sources CS1 to CSM in a symmetrical manner allows the error resulted from the current sources CS1 to CSM to be offset by each other as much as possible, thereby decreasing the integral nonlinearity error of the step current of the current output circuit 100.

Moreover, generally speaking, when the current source array 110 includes more current sources (that is, when the value of M is greater), the overall distribution of the degree of the error generated by current sources CS1 to CSM is closer to a normal distribution, and hence, the selection order that the current source control circuit 130 relies on can reduce the integral nonlinearity error of the step current more effectively.

In some embodiments, the current output circuit 100 can be used in a digital to analog converter. In this case, the target output value of the current output circuit 100 is a value corresponding to the digital input signal; however, the present disclosure is not limited to applying the current output circuit 100 in a digital to analog converter, and in other embodiments, the current output circuit 100 can be used in other applications requiring the output of the step current.

Figure 4:
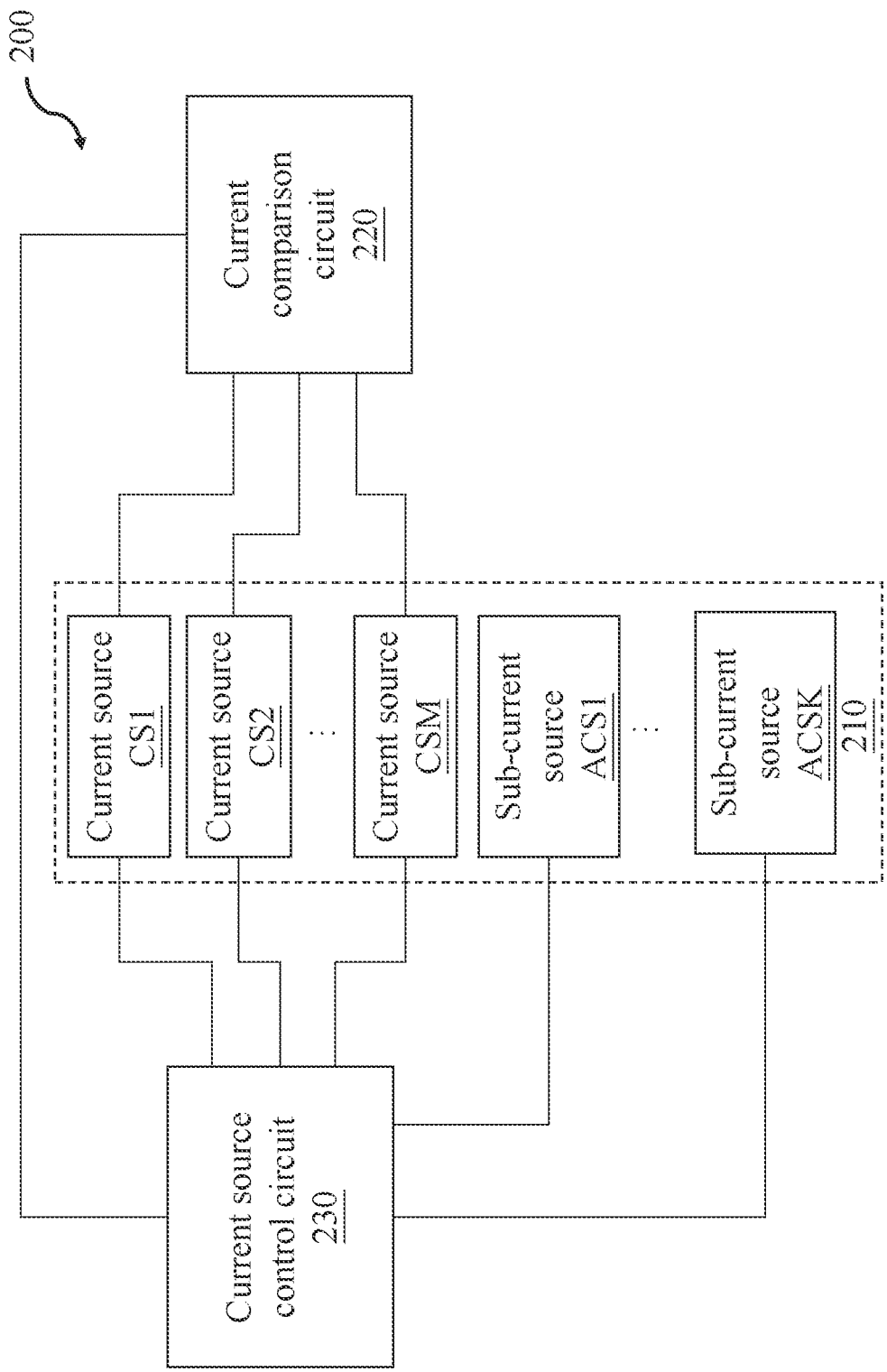
FIG. 4 is a schematic diagram illustrating a current output circuit according to another embodiment of the present application.

FIG. 4 is a schematic diagram illustrating a current output circuit 200 according to one embodiment of the present application. The current output circuit 100 and the current output circuit 200 have similar structures and can operate following similar principles; however, in the current output circuit 200, the current source array 210 may further include a plurality of sub-current sources ACS1 to ACSK, wherein K is a positive integer greater than 1. The sub-current sources ACS1 to ACSK are coupled to the current source control circuit 230, and the current source control circuit 230 can control the sub-current sources ACS1 to ACSK, respectively.

In the present embodiment, the sub-current sources ACS1 to ACSK may have the same target current value, and the target current value of the current sources CS1 to CSM may be greater than the target current value of the sub-current sources ACS1 to ACSK. Additionally, in the present embodiment, a target current value of the sub-current sources ACS1 to ACSK is less than the target current value of each of the current sources CS1 to CSM, and the difference between the sum of the target current values of the sub-current sources ACS1 to ACSK and the target current value of each of the current sources CS1 to CSM can be the target current value of each of the sub-current sources ACS1 to ACSK. That is, the current sources CS1 to CSM with a larger target current can be regarded as the most significant current source, and the sub-current sources ACS1 to ACSK with a smaller target current can be regarded as the least significant current source. The two can be used in combination to output the required step current; however, the present application is not limited thereto.

Further, the value of K can be (2L−1), wherein L is an integer greater than 1. That is, the quantity of the sub-current sources ACS1 to ACSK may differ from the quantity of the current sources CS1 to CSM depending on the system's requirement.

Since the current sources CS1 to CSM have a greater target current value, the error of the current sources CS1 to CSM would affect, to a greater extent, the integral nonlinearity error observed when the current output circuit 200 outputs the step current. Therefore, in the present embodiment, the current comparison circuit 220 may perform a sorting operation on the current sources CS1 to CSM having the greater target current values and can use the current source control circuit 230 to divide the current sources CS1 to CSM into N current source sets according to a predetermined selection order, so as to control them separately. However, for the sub-current sources ACS1 to ACSK having smaller target current values, it is feasible to use the current source control circuit 230 to directly control the sub-current sources ACS1 to ACSK individually, according to specified rules without performing the sorting operation. For example, according to the target output value of the current output circuit 200, the current source control circuit 230 may determine the current sources from the N current source sets to be enabled according to a binary coding sequence and can determine a number of the sub-current sources to be enabled according to a thermometer coding sequence capable of keeping the monotonicity to output the current. In this way, it is feasible to decrease the number of the sorting operation, thereby simplifying the operation of the current output circuit 200. However, the present disclosure is not limited to the examples that use the thermometer coding sequence to determine the sequence in which the sub-current sources ACS1 to ACSK are enabled. For example, in some other embodiments, the sequence in which the sub-current sources ACS1 to ACSK are enabled can be determined according to a binary coding sequence.

Since the current output circuits 100 and 200 can perform the sorting operation on the current sources and can divide the current sources according to the result of the sorting operation, the error of the current sources are offset by each other, and therefore, it is feasible to decrease the integral nonlinearity error value of the step current, as well as to reduce the integral nonlinearity error value observed when the current output circuits 100 and 200 output the step current. Moreover, since the current output circuits 100 and 200 can divide the current sources according to a predetermined selection order, there is no need to perform the sorting operation or other complex operations repeatedly, thereby simplifying the operation of the current output circuits 100 and 200.

Figure 5:
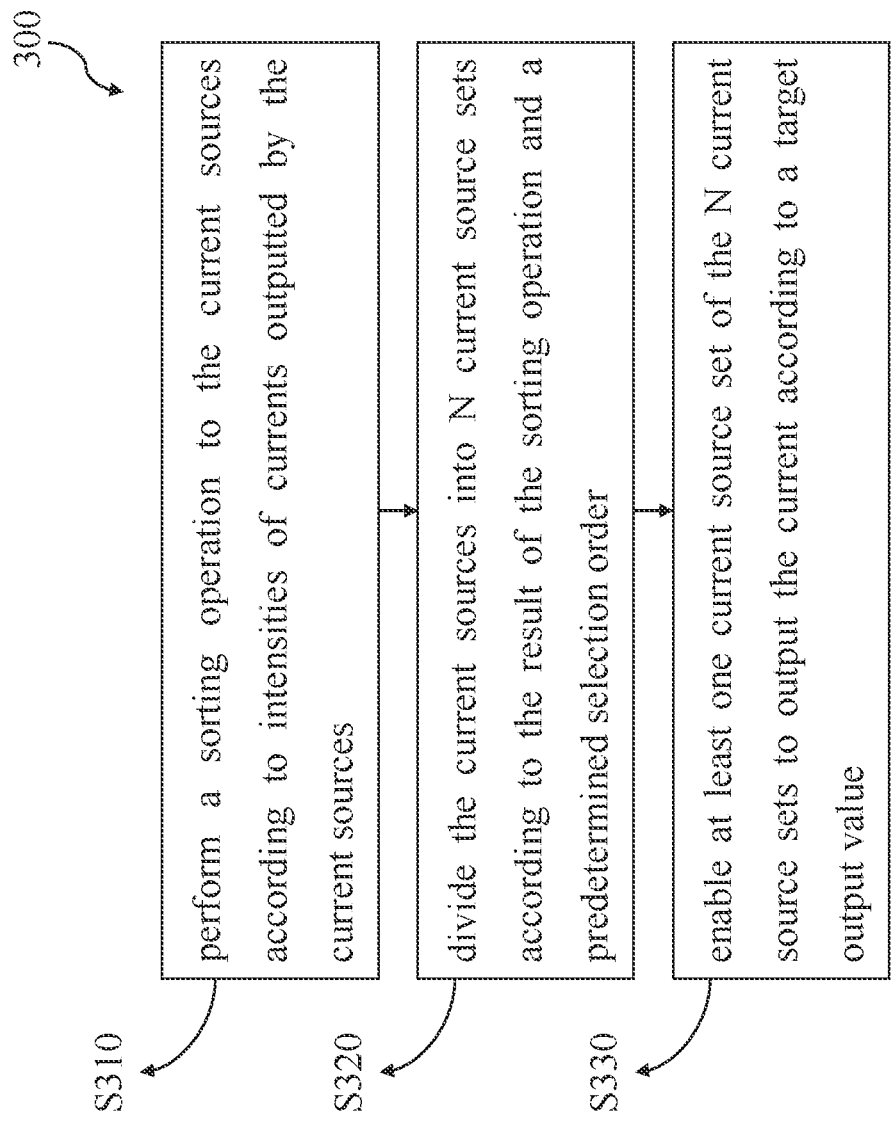
FIG. 5 is a flow chart illustrating a method for outputting current according to one embodiment of the present disclosure.

FIG. 5 is a flow chart illustrating a method 300 for outputting current according to one embodiment of the present disclosure. In some embodiments, the method 300 can be applied in the current output circuits 100 and 200. The method 300 may include Step S310 to Step S330.

S310: perform a sorting operation on the current sources CS1 to CSM according to intensities of currents outputted by the current sources CS1 to CSM;

S320: divide the current sources CS1 to CSM into N current source sets according to the result of the sorting operation and a predetermined selection order;

S330: enable at least one current source set of the N current source sets to output the current according to a target output value.

After completing the sorting operation in the Step S310, the Step S320 can divide the current sources CS1 to CSM into N current source sets according to the result of the sorting operation and the predetermined selection order. For example, in the Step S320, the median current source having a current intensity ranked as the median is first selected as the first current source set of the N current source sets, and then, the $2^{(n-2)}$ current sources starting from the $[2^{(n-1)}-1]^{th}$ place before the median current source in the current intensity ranking, as well as $2^{(n-2)}$ current sources starting from the $[2^{(n-1)}-1]^{th}$ place after the median current source in the current intensity ranking are selected as the $n^{th}$ current source set of the N current source sets.

In other words, the Step S320 may use the median current source as a reference, and then select each current source into a corresponding current source set in a symmetrical manner. In this way, in Step S330, it is feasible to enable the corresponding current source set in the N current source sets to output current according to the target output value. In some embodiments, the method 300 can be applied in a DAC. In this case, the method 300 may first obtain the target output value according to the digital input signal and then output the current according to the target output value in the Step S330.

In some embodiments, if the overall distribution of the degree of the error of the current sources CS1 to CSM is a normal distribution, dividing the current sources CS1 to CSM into N current source sets for binary coding according to the above-mentioned predetermined selection order will allow the current sources CS1 to CSM to effectively offset the error with each other, thereby decreasing the integral nonlinearity error value of the step current of current output circuits 100 and 200.

In some embodiments, when applying the method 300 in the current output circuit 200, the Step S330, in addition to controlling the N current source sets, can also respectively control the sub-current sources ACS1 to ACSK to output the current corresponding to the target output value. That is, the method 300 can perform the sorting operation on the current sources CS1 to CSM having a greater target current value, and dividing the current sources CS1 to CSM into N current source according to a predetermined selection order, so as to control them separately. However, for the sub-current sources ACS1 to ACSK having smaller target current values, it is feasible to directly control the sub-current sources ACS1 to ACSK individually, according to specified rules, without performing the sorting operation. In this way, it is possible to decrease the number of sorting operations, thereby simplifying the operation of the current output circuit 200. For example, method 300 can determine the current sources in the N current source sets to be enabled according to the target output value and a binary coding sequence and can determine a number of the sub-current sources in the sub-current sources ACS1 to ACSK to be enabled according to the target output value and a thermometer coding sequence. However, the present disclosure is not limited to the examples that use the thermometer coding sequence to determine the sequence in which the sub-current sources ACS1 to ACSK are enabled. For example, in some other embodiments, the sequence in which the sub-current sources ACS1 to ACSK are enabled can be determined according to a binary coding sequence.

In summary, the current output circuit and method for outputting current provided by embodiments of the present disclosure can perform the sorting operation on current sources and can divide current sources according to the result of the sorting operation so that the error of the current sources may be offset by each other, thereby decreasing the integral nonlinearity error value of the step current and improving the linearity of the DAC circuit when converting digital signals into current outputs. Moreover, since after the sorting operation, the current sources are only divided according to a predetermined selection order, the operation process can be further simplified.

What is claimed is:

1. A method for outputting current, comprising:
performing a sorting operation on a plurality of current sources according to intensities of currents outputted by the plurality of current sources;
dividing the plurality of current sources into N current source sets according to a result of the sorting operation and a predetermined selection order; and
enabling at least one current source set of the N current source sets to output a current according to a target output value;
wherein,
the plurality of current sources have a same first target current value;
each current source set of the N current source sets comprises at least one current source;
in the N current source sets, a total quantity of current sources of an $n^{th}$ current source set is twice a total quantity of current sources of an $(n-1)^{th}$ current source set; and
N is an integer greater than 1, and n is an integer greater than 1 and smaller than or equal to N.

2. The method of claim 1, wherein the step of dividing the plurality of current sources into N current source sets according to the result of the sorting operation and the predetermined selection order comprises:
selecting a median current source having a median current intensity among the plurality of current sources as a first current source set of the N current source sets; and
according to the result of the sorting operation, selecting a current source that precedes the median current source and a current source that succeeds the median current source as a second current source set of the N current source sets.

3. The method of claim 2, wherein the step of dividing the plurality of current sources into N current source sets according to the result of the sorting operation and the predetermined selection order comprises:
according to the result of the sorting operation, selecting two current sources that are two places before and three places before the median current source and two current sources that are two places after and three places after the median current source as a third current source set of the N current source sets.

4. The method of claim 1, wherein the step of dividing the plurality of current sources into N current source sets according to the result of the sorting operation and the predetermined selection order comprises:

selecting a median current source having a median current intensity among the plurality of current sources as a first current source set of the N current source sets; and selecting $2^{(n-2)}$ current sources starting from the $[2^{(n-1)}-1]^{th}$ place before the median current source and $2^{(n-2)}$ current sources starting from the $[2^{(n-1)}-1]^{th}$ place after the median current source as an $n^{th}$ current source set of the N current source sets.

5. The method of claim 1, wherein the step of enabling at least one current source set of the N current source sets to output the current according to the target output value comprises:

enabling the at least one current source set of the N current source sets and at least one sub-current source of a plurality of sub-current sources to output the current according to the target output value;

wherein, the plurality of sub-current sources have a same second target current value; and the first target current value is greater than the second target current value.

6. The method of claim 5, wherein the step of enabling the at least one current source set of the N current source sets and at least one sub-current source of the plurality of sub-current sources to output the current according to the target output value comprises:

determining the at least one current source set of the N current source sets to be enabled according to the target output value and a binary coding sequence; and determining a number of the plurality of sub-current sources to be enabled according to the target output value and a thermometer coding sequence or another binary coding sequence.

7. The method of claim 5, wherein a total target current value of the plurality of sub-current sources is less than the first target current value.

8. The method of claim 7, wherein:

the plurality of sub-current sources comprise $(2^L-1)$ sub-current sources, wherein L is an integer greater than 1.

9. The method of claim 1, further comprising:

receiving a digital input signal to obtain the target output value.

10. The method of claim 1, wherein the plurality of current sources comprise $(2^N-1)$ current sources.

11. A current output circuit, comprising:

a current source array comprising a plurality of current sources, wherein the plurality of current sources have a same first target current value;

a current comparison circuit coupled to the plurality of current sources, and configured to compare intensities of currents outputted by the plurality of current sources to perform a sorting operation on the plurality of current sources; and a current source control circuit coupled to the plurality of current sources and the current comparison circuit, and configured to divide the plurality of current sources into N current source sets for individual control according to the result of the sorting operation and a predetermined selection order, and to enable at least one current source set of the N current source sets to output a current according to a target output value;

wherein, each current source set of the N current source sets comprises at least one current source;

in the N current source sets, a total quantity of current sources of an $n^{th}$ current source set is twice a total quantity of current sources of an $(n-1)^{th}$ current source set; and N is an integer greater than 1, and n is an integer greater than 1 and smaller than or equal to N.

12. The current output circuit of claim 11, wherein the current source control circuit is configured to:

select a median current source having a median current intensity among of the plurality of current sources as a first current source set of the N current source sets; and according to the result of the sorting operation, select a current source that precedes the median current source and a current source that succeeds the median current source as a second current source set of the N current source sets.

13. The current output circuit of claim 12, wherein the current source control circuit is configured to:

select two current sources that are two places before and three places before the median current source and two current that are two places after and three places after the median current source having the median current intensity as a third current source set of the N current source sets.

14. The current output circuit of claim 11, wherein the current source control circuit is configured to:

select a median current source having a median current intensity among of the plurality of current sources as a first current source set of the N current source sets; and select $2^{(n-2)}$ current sources starting from the $[2^{(n-1)}-1]^{th}$ place before the median current source and $2^{(n-2)}$ current sources starting from the $[2^{(n-1)}-1]^{th}$ place after the median current source as an $n^{th}$ current source set of the N current source sets.

15. The current output circuit of claim 11, wherein the current source array further comprises:

a plurality of sub-current sources coupled to the current source control circuit, wherein the plurality of sub-current sources have a same second target current value;

wherein, the first target current value is greater than the second target current value; and the current source control circuit is further configured to respectively control the plurality of sub-current sources.

16. The current output circuit of claim 15, wherein the current source control circuit is configured to:

determine the at least one current source of the N current source sets to be enabled according to the target output value and a binary coding sequence; and determine a number of the plurality of sub-current sources to be enabled according to the target output value and a thermometer coding sequence or another binary coding sequence.

17. The current output circuit of claim 15, wherein a total target current value of the plurality of sub-current sources is less than the first target current value.

18. The current output circuit of claim 17, wherein:

the plurality of sub-current sources comprise $(2^L-1)$ sub-current sources, wherein L is an integer greater than 1.

19. The current output circuit of claim 11, wherein the current output circuit is configured to receive a digital input signal to obtain the target output value.

20. The current output circuit of claim 11, wherein the plurality of current sources comprise $(2^N-1)$ current sources.

\* \* \* \* \*